US012811586B2

(12) United States Patent
Faber

(10) Patent No.: US 12,811,586 B2
(45) Date of Patent: Nov. 24, 2026

(54) PROXIMITY SWITCH AND METHOD FOR DETECTING A TRIGGER

(71) Applicant: Turck Holding GmbH, Halver (DE)

(72) Inventor: Michael Faber, Altena (DE)

(73) Assignee: Turck Holding GmbH, Halver (DE)

( * ) Notice: Subject to any disclaimer, the term of this patent is extended or adjusted under 35 U.S.C. 154(b) by 144 days.

(21) Appl. No.: 18/950,261

(22) Filed: Nov. 18, 2024

(65) Prior Publication Data

US 2025/0080113 A1 Mar. 6, 2025

Related U.S. Application Data

(63) Continuation-in-part of application No. PCT/EP2023/060490, filed on Apr. 21, 2023.

(30) Foreign Application Priority Data

May 19, 2022 (DE) ..................... 10 2022 112 541.6

(51) Int. Cl.
*H03K 17/95* (2006.01)

(52) U.S. Cl.
CPC ..... *H03K 17/9525* (2013.01); *H03K 17/9522* (2013.01); *H03K 2017/9527* (2013.01)

(58) Field of Classification Search
None
See application file for complete search history.

(56) References Cited

U.S. PATENT DOCUMENTS 6,853,182 B2 2/2005 Faber
2005/0184814 A1* 8/2005 Ehls ..................... H03K 17/952 331/65

(Continued)

FOREIGN PATENT DOCUMENTS

DE 41 02 542 A1 7/1992
DE 103 18 350 B3 12/2004

(Continued)

OTHER PUBLICATIONS

Search Report issued in DE 10 2022 112 541.6, to which this application claims priority, mailed Mar. 17, 2023 (English-language machine translation attached).

(Continued)

*Primary Examiner* — Raul J Rios Russo
*Assistant Examiner* — Carl F.R. Tchatchouang
(74) *Attorney, Agent, or Firm* — Pearl Cohen PartGmbB; Raphael Tautz

(57) ABSTRACT

A proximity switch, comprising a coil arrangement including at least two receiving coils and at least one transmitting coil, and a control and evaluation unit arranged downstream of the coil arrangement, the control and evaluation unit being configured to obtain a switching signal when a target approaches a predefined response distance of the proximity switch. The at least two receiving coils and the at least one transmitting coil are planar coils and are arranged in a common coil plane being arranged completely within one single copper layer. The common coil plane is oriented perpendicular to a longitudinal axis of the proximity switch. The at least two receiving coils and the at least one transmitting coil do not overlap one another in the direction of the longitudinal axis and do not enclose one another circumferentially.

8 Claims, 5 Drawing Sheets

(56) References Cited

U.S. PATENT DOCUMENTS

| | | | | |
|---|---|---|---|---|
| 2018/0204118 A1* | 8/2008 | Kuhn | ................. | H03K 17/9505 327/517 |
| 2018/0331684 A1* | 11/2018 | Koizumi | ................ | G01D 5/204 |
| 2018/0340989 A1* | 11/2018 | Latham | .................. | G01D 5/147 |
| 2018/0375516 A1* | 12/2018 | Nagel | .................. | G01N 27/028 |

FOREIGN PATENT DOCUMENTS

| | | | | |
|---|---|---|---|---|
| DE | 20 2006 004 158 U1 | 10/2006 | | |
| DE | 10 2006 053 023 A1 | 8/2007 | | |
| DE | 102006053222 A1 * | 5/2008 | ......... | H03K 17/9537 |
| DE | 102015117075 A1 * | 4/2017 | ............. | G01B 7/003 |
| DE | 100 57 773 B4 | 5/2021 | | |
| EP | 1 422 492 A1 | 5/2004 | | |

OTHER PUBLICATIONS

International Search Report and Written Opinion issued in PCT/EP2023/060490, to which this application claims domestic benefit, mailed Jul. 21, 2023 (English-language machine translation attached).

* cited by examiner

PROXIMITY SWITCH AND METHOD FOR DETECTING A TRIGGER

CROSS REFERENCE TO RELATED APPLICATIONS

This application is a continuation-in-part application of international patent application PCT/EP2023/060490, filed on Apr. 21, 2023, and designating the U.S., which claims priority to German patent application 10 2022 112 541.6 filed on May 19, 2022, both of which are hereby incorporated by reference in their entireties.

TECHNICAL FIELD

The present disclosure relates to a proximity switch and a method for detecting a target.

BACKGROUND

DE 20 2006 004 158 U1 is directed to an inductive proximity switch being equipped with at least one receiving coil, an oscillator circuit and at least two receiving coils arranged in the alternating magnetic field of the transmitting coil. The receiving coil and the transmitting coils are arranged adjacently on a circuit board, wherein an evaluation circuit connected to the transmitting coils is provided which, when a target approaches the proximity switch, generates a switching signal. The two receiving coils and the transmitting coil, according to DE 20 2006 004 158 U1, each consist of at least one annular, elliptical, polygonal or spirally shaped winding, wherein either the transmitting coil is surrounded peripherally by the first receiving coil and this is in turn surrounded peripherally by the second receiving coil.

DE 10 2006 053 023 A1 is directed to a proximity switch comprising a coil arrangement generating an alternating magnetic field, which has a main transmitting coil and a compensating coil surrounding the latter coaxially. The proximity switch also has a receiving coil, wherein the transmitting coil and the compensating coil are fed with alternating currents of opposite phase, wherein the transmitting coil is wired oppositely to the compensating coil, has a greater number of windings than the compensating coil, and the transmitting coil and the compensating coil are energized by a common alternating voltage generator, so that the magnetic field generated by the transmitting coil is greater than the magnetic field generated by the compensating coil.

DE 100 57 773 B4 is directed to a proximity switch comprising a coil arrangement having a coil and an evaluation circuit connected downstream thereof to obtain a switching signal during a field strength change when a target of the coil arrangement approaches the desired response distance, wherein the at least one coil is formed from partial coils which are connected electrically in series and arranged axially parallel to each other, characterized in that the partial coils are arranged beside one another in a common plane and connected in series with the same winding direction.

One possible object of the present disclosure may be to propose an improved proximity sensor and an associated method for detecting a target, wherein there is a more stable zero state and less interference occurs.

SUMMARY

A proximity switch comprises a coil arrangement having at least two receiving coils and at least one transmitting coil, and a control and evaluation unit arranged downstream of the coil arrangement, the control and evaluation unit being configured to obtain a switching signal when a target approaches a predefined response distance of the proximity switch. The at least two receiving coils and the at least one transmitting coil are planar coils and are arranged in a common coil plane being arranged completely within one single copper layer. The common coil plane is oriented perpendicular to a longitudinal axis of the proximity switch. Coil axes of the at least two receiving coils and the at least one transmitting coil are each arranged in parallel to the longitudinal axis. The at least two receiving coils and the at least one transmitting coil do not overlap one another in the direction of the longitudinal axis and do not enclose one another circumferentially.

BRIEF DESCRIPTION OF THE DRAWINGS

Further aspects of the disclosure will now be explained with respect to the drawings. The drawings and examples shown therein as well as the following description thereof should not be construed as limiting, but rather as one out of many possible ways to carry out the disclosure.

In the drawings.

DESCRIPTION

Figure 1:
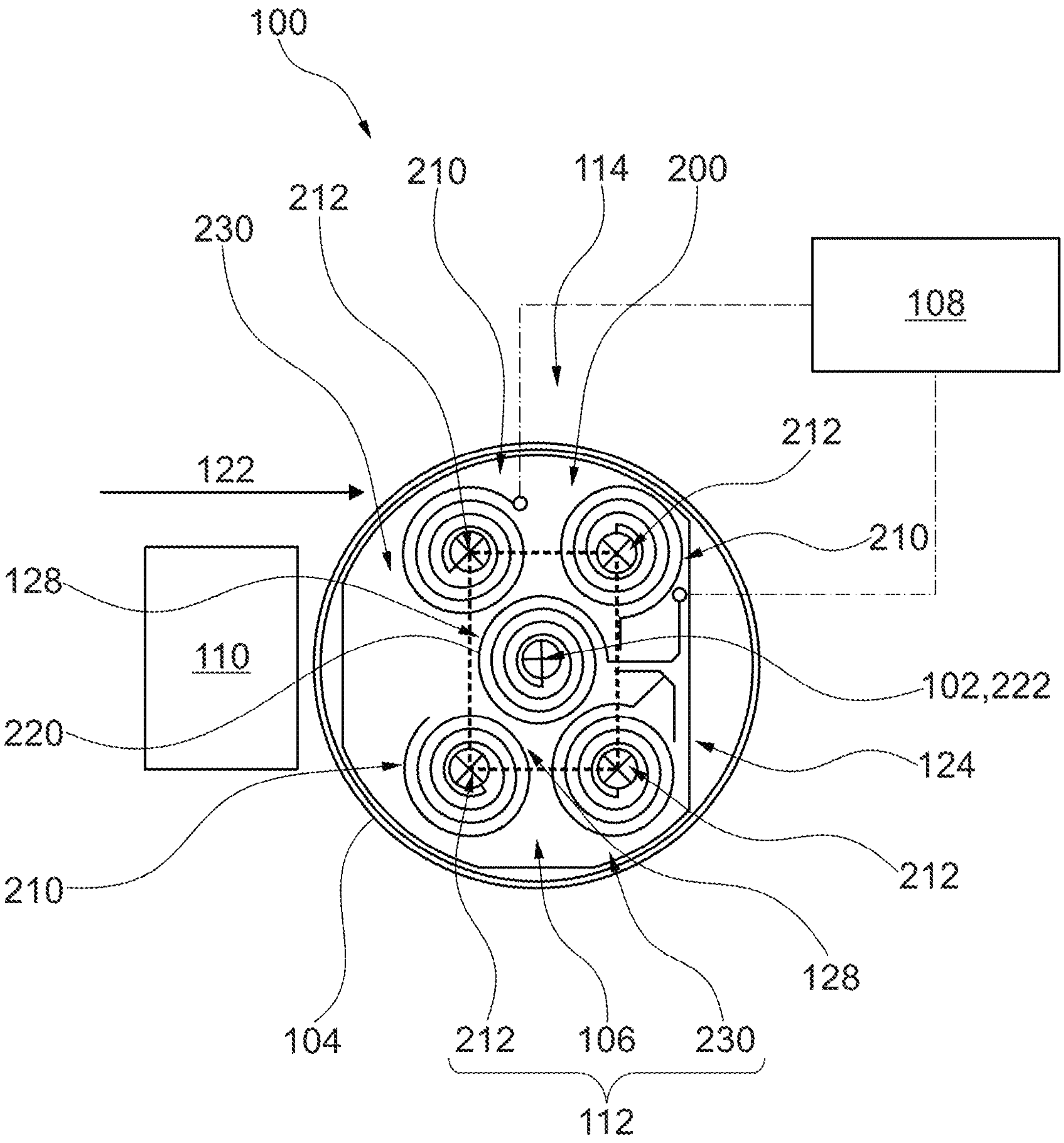
FIG. 1 shows a sectional illustration of a proximity sensor as a top view of a coil arrangement of a first embodiment.

A proximity switch may be provided. The proximity switch comprises a coil arrangement having at least two receiving coils and at least one transmitting coil. The proximity switch comprises a control and evaluation unit being arranged downstream of the coil arrangement, the control and evaluation unit being configured to obtain a switching signal when a target approaches a predefined response distance of the proximity switch. The at least two receiving coils and the at least one transmitting coil are planar coils and are arranged in a common coil plane being arranged completely within one single copper layer. The common coil plane is oriented perpendicular to a longitudinal axis of the proximity switch. Coil axes of the at least two receiving coils and the at least one transmitting coil are each arranged in parallel to the longitudinal axis. The at least two receiving coils and the at least one transmitting coil do not overlap one another in the direction of the longitudinal axis and do not enclose one another circumferentially.

A switching signal may be generated during a field strength change which occurs because of the presence of a trigger (target).

The arrangement of the individual coils in a common coil plane being arranged completely within one single copper layer may mean that the individual coils are completely located within the single copper layer and within the copper layer in one plane.

A coil or windings of the coil may be formed as a flat spiral. A first terminal of the coil may be arranged radially on the outside of the spiral at one end of the windings, and a second terminal of the coil may be arranged radially on the inside of the spiral at the other end of the windings, i.e. in the center or on a central inner surface of the respective coil. The connection between the second end of the winding and a further termination point may be established through the circuit board and optionally at least over a distance on the rear side of the circuit board.

The receiving coils may be connected in series. The transmitting coil may have windings in the opposite direction to the receiving coils or a current may flow through it in the opposite direction to the receiving coils.

The coil arrangement may function on a transformer-based coupling factor principle, in which the receiving coils may be excited by an oscillator or form an oscillator circuit. The at least one transmitting coil may be arranged adjacently in this alternating magnetic field of the receiving coils. The control and evaluation unit connected to the transmitting coil may generate a switching signal from the changed output or quiescent signals from the transmitting coil upon the approach of a trigger in the detection range of the proximity switch.

The coil axis of the at least one transmitting coil may be located radially on the inside in the common coil plane, and the at least two coil axes of the receiving coils may be located radially on the outside in the common coil plane.

Optionally, exactly one transmitting coil may be provided, the coil axis of which may extend in alignment with the longitudinal axis, wherein the coil axes of the at least two receiving coils may have an identical spacing from the coil axis of the transmitting coil. At least two groups or pairs of receiving coils may be arranged symmetrically relative to the coil axis of the central transmitting coil. Optionally, the receiving coils or their coil axes are arranged at an identical angular spacing around the transmitting coil or its coil axis.

The coil axes of all the receiving coils may be at the identical or substantially identical distance from the coil axis of the central transmitting coil. This may lead to a uniform and stable magnetic field.

One transmitting coil may thus be positioned in the center of the coil arrangement (being located completely within one Cu-layer) and around said transmitting coil a plurality of annular receiving coils may be arranged, which may form a differential voltage as a result of the electrical interconnection. In this way, position detection of metallic triggers (targets) can be carried out, optionally irrespective of their conductivity. There may thus be a factor 1, which can be evaluated at the industrially usual detection (switching) distance.

Optionally, three to six receiving coils may be provided, the coil axes of which may be arranged concentrically around the coil axis of the transmitting coil. The distances of the receiving coil or the coil axes thereof from one another may be the same or may be different, and optionally may have a symmetry. Thereby, a uniform distribution of the magnetic field may be achieved.

Each receiving coil may have a number S of windings, and each transmitting coil may have a number E of windings. A ratio $\Sigma S/\Sigma E$ may be in the range from 0.46 to 0.30, optionally in the range from 0.43 to 0.32. Four receiving coils each having 3.5 windings and the one central transmitting coil having 5.5 windings may be provided, resulting in a ratio of 0.393.

The ratio of the coil base surfaces of a receiving coil to a transmitting coil may be 1 plus/minus 0.2. Here, only the surface area covered by the optionally spiral windings may be understood as the coil base surface; optionally conductors or conductor tracks that may be necessary do not define the coil base surface.

The coil arrangement may be designed in such a way that a differential voltage is formed by the electrical interconnection of receiving coils and transmitting coils.

The spacing or distance in the common coil plane between the outermost winding of a receiving coil and the outermost winding of the transmitting coil may be a multiple of the winding spacing of a receiving coil, wherein the multiple lies in the range from 0.8 to 3, ideally in the range from 0.8 to 1.5. This may lead to a dense magnetic field and may reduce interference.

The winding spacing may be defined as the vertical distance in the radial direction between two windings of a spiral that run in parallel. Optionally, the receiving coils are built up identically or largely identically at least with respect to the number of windings and their dimensions.

Optionally, a method with which a trigger (target) can be detected may be provided, wherein a proximity switch with associated wiring and evaluation unit may be used, and wherein the proximity switch may be designed as described above.

The coil system for the inductive proximity sensor may have a reduction factor of 1 for all metals, may have a simple structure and may be distinguished by a high temperature and long-term stability.

Optionally, no ferrite core is needed, so that external magnetic fields do not exert any disruptive influence on the sensor. The coil system may be designed to give no directional priority, so that detection can be performed from both sides of the circuit board with an identical sensitivity and action.

FIG. 1 shows a proximity sensor 100. The proximity sensor 100 comprises a housing 104 in which a circuit board 106 having a coil arrangement 200 made of four receiving coils 210 and a transmitting coil 220 is arranged. The top side of the circuit board 106 forms a common coil plane 230. The receiving coil 210 has a coil axis 212, and the transmitting coil 220 has a coil axis 222, wherein the coil axis 222 of the transmitting coil 220 coincides with the longitudinal axis 102 of the coil arrangement 200 and the proximity sensor 100. The axes protruding from the image plane are symbolized by a circle with an internal "X".

The receiving coils 210 and the transmitting coils 220 and their windings run concentrically around the respective coil axis 212, 222. The longitudinal axis 102 of the coil arrangement 200 is located in the center of all the coil axes 212, 222 and forms the center of the coil arrangement 200.

The circuit board 106 is arranged parallel to the section plane, not illustrated, which is aligned parallel to the image plane. A control and evaluation unit 108 is connected to the circuit board 106 and electronic components 118 (FIG. 5) arranged thereon.

Also illustrated in FIG. 1 is a trigger 110 (target), which moves in the direction 122 of the proximity sensor 100 and is located in the illustrated position still outside a response distance 112 of the proximity sensor 100.

All the coils of the coil arrangement 200 are formed as planar coils which have been attached to a surface of the circuit board 106, optionally by means of a melting or printing method. The four receiving coils 210 are connected in series and are conductively connected to one another on the bottom of the circuit board 106.

The central transmitting coil 220 is positioned in the center of the coil arrangement 200 and the four receiving coils 210 are arranged around the same, the coil arrangement 200 being formed completely within one single copper layer (Cu-layer). As a result of the electrical interconnection, a difference voltage is formed, the change of which represents the detection of a metallic trigger (target). This is done independently of the conductivity of the trigger. There is thus a factor 1, which can be evaluated at the industrially usual detection (switching) distance.

The electrical interconnection is, as described above, a series circuit of the four receiving coils 210. The individual coils 210 are electrically connected to one another such that as a result of the direction of the current flow, a difference voltage over all the receiving coils 210 results, with which the coil arrangement 200 can be calibrated. This difference voltage to be evaluated results in a zero crossing.

Figure 2:
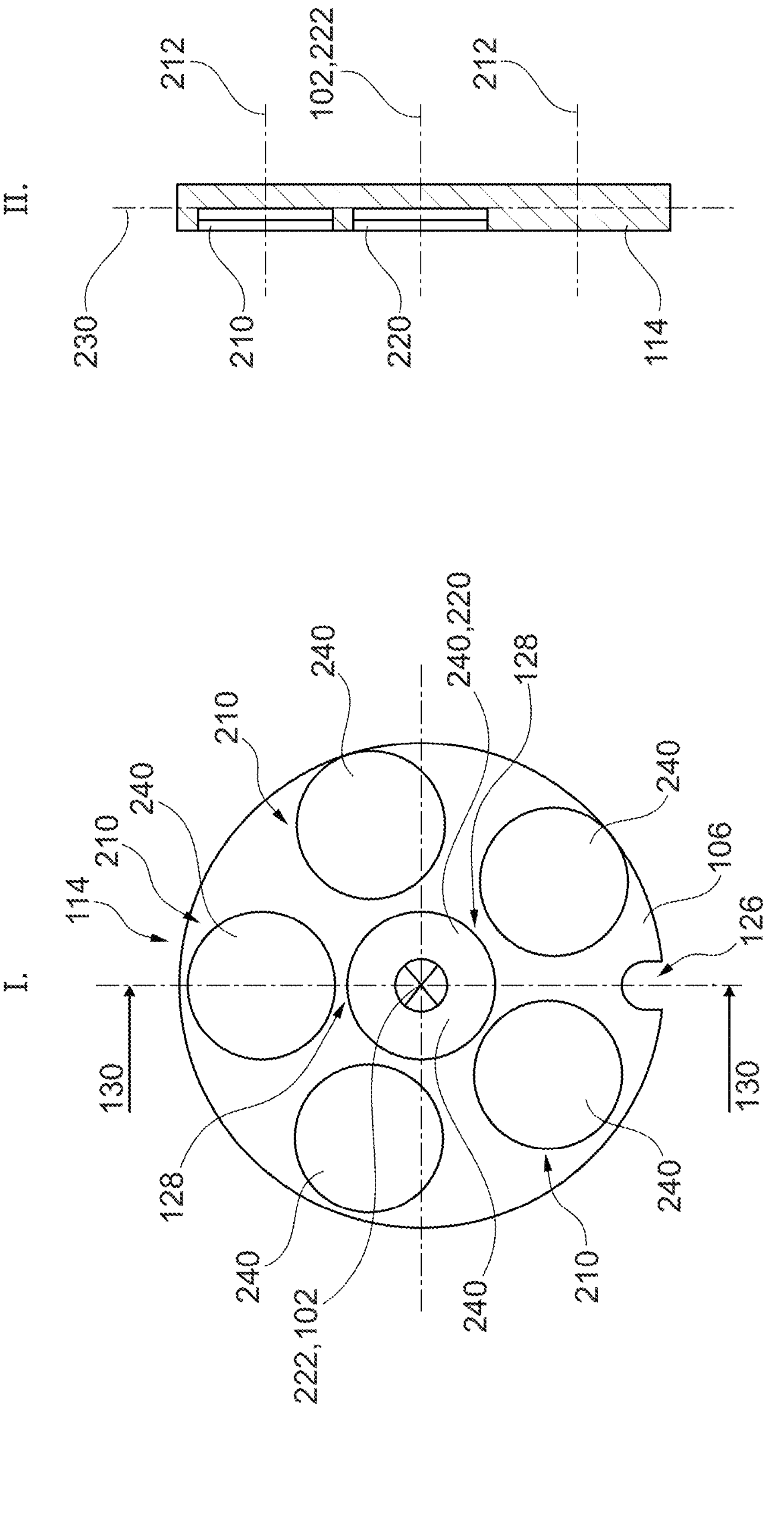
FIG. 2 shows a second embodiment of the coil arrangement.
Figure 3:
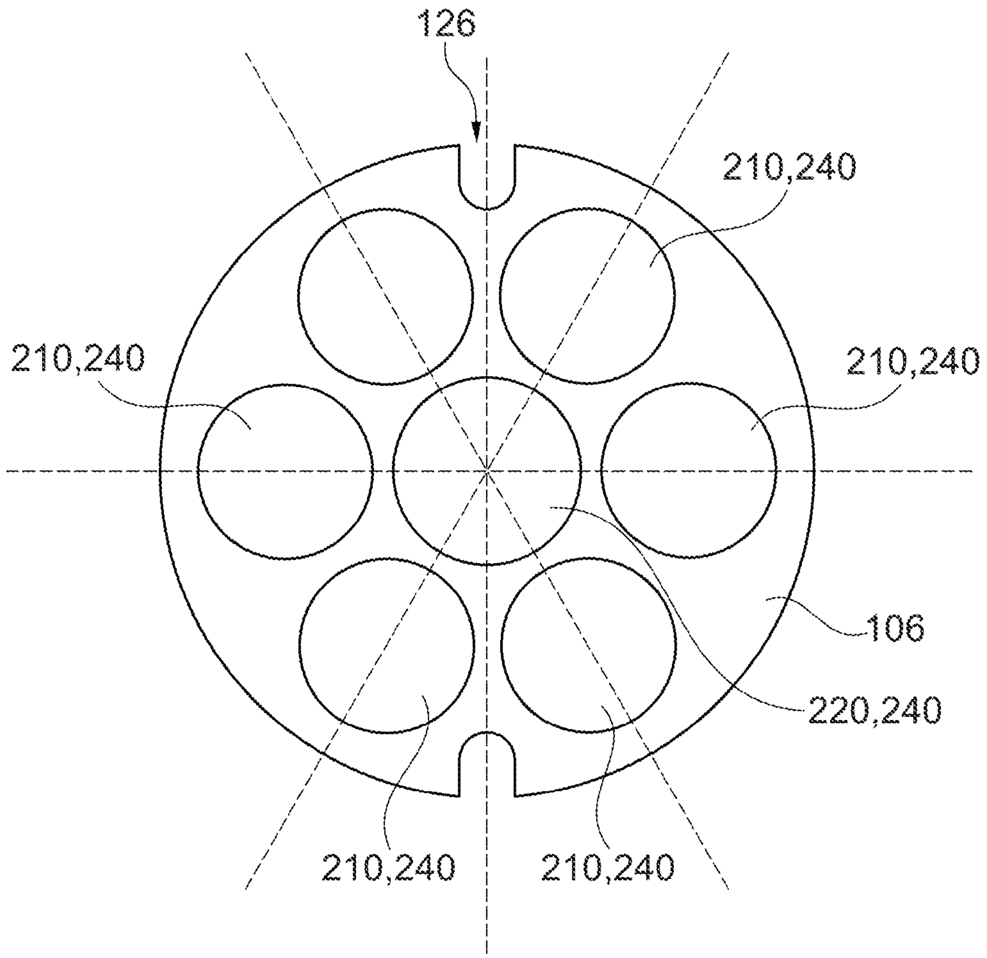
FIG. 3 shows a third embodiment of the coil arrangement.
Figure 4:
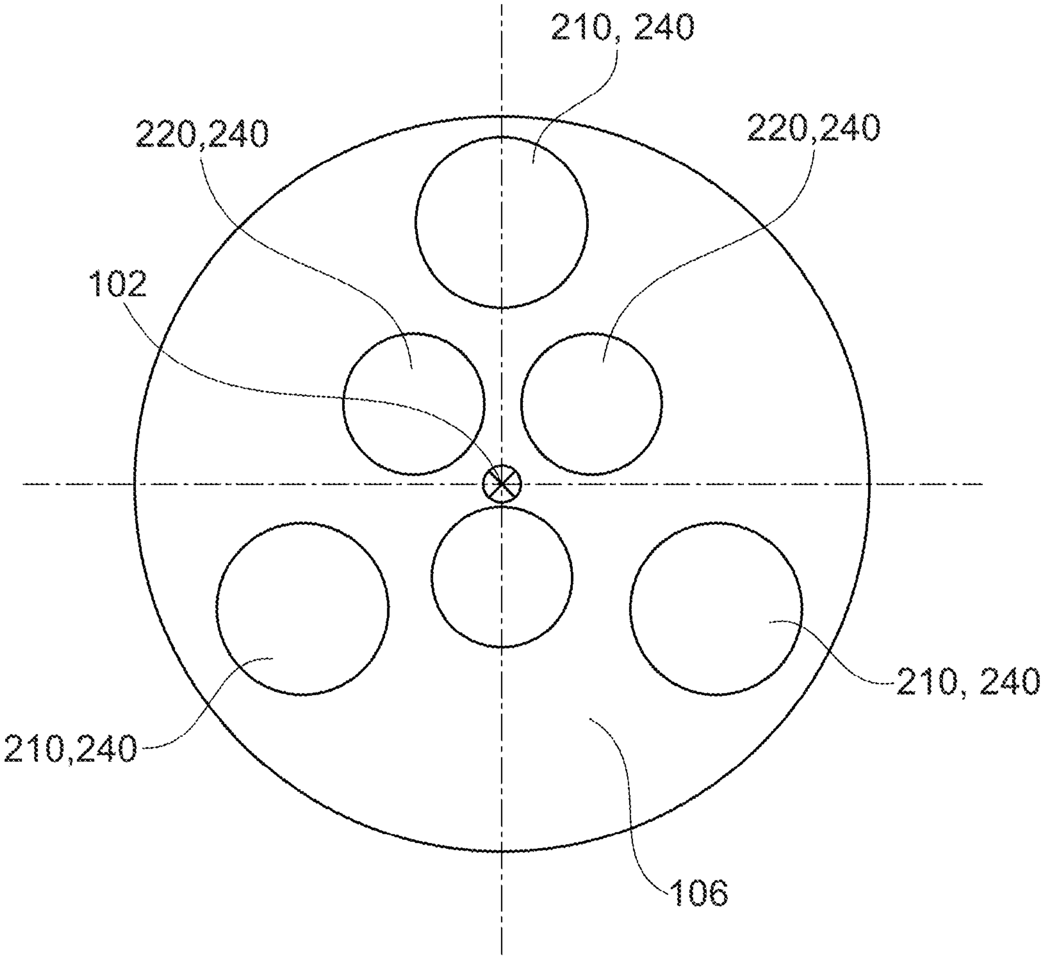
FIG. 4 shows a fourth embodiment of the coil arrangement.

The coils 210, 220, more specifically their respective coil base surfaces 240, which can be seen in FIGS. 2, 3 and 4, do not overlap. In the example shown in FIG. 1, the four receiving coils 210 are not arranged in symmetry with identical angular spacings around the central transmitting coil 220, wherein an angle is meant which has as its center the point at which the longitudinal axis 102 passes through the coil plane 230 and runs through the points in the coil plane 230 at which the respective coil axes 212 of the receiving coils 210 pass through the coil plane 230. As shown in FIG. 1, the upper pair of receiving coils 210 enclose between themselves a first angle, which is identical to the angle enclosed by the lower pair of receiving coils 210. A larger second angle is spanned between the left-hand upper and the left-hand lower receiving coil 210, which is formed analogously between the right-hand receiving coils 210.

The four coil axes 212 of the four receiving coils 210 are arranged at an identical radius or distance from the longitudinal axis 102 and therefore also from the coil axis 222 of the transmitting coil 220. Furthermore, the circuit board 106 has guide surfaces 124 as flattened portions, which are used for positioning within the housing 104.

Therefore, the receiving coils 210 can be brought close to the central transmitting coil 220 and also, in the second angle, enough space is available for necessary soldering.

The spacing 128 of the outermost winding of the transmitting coil 220 from the respective opposite outermost winding of one of the receiving coils 210 on the distance between the respective coil axes 222, 212 is equal to the inner winding spacing of the receiving coil 210 or the transmitting coil 220.

FIG. 2 shows an arrangement of a coil arrangement 200 having five receiving coils 210 and a central transmitting coil 220, which are located in a common coil plane 230 within the same copper layer 114, as can be seen in the sectional illustration of part II of the FIG.

Part I of the FIG. illustrates that the receiving coils 210 or their coil axes 212 are arranged symmetrically as petaloids around the central longitudinal axis 102 or the central coil axis 222 of the transmitting coil 220. Furthermore, the reference symbol 130 indicates the direction of the view of the sectional illustration in part II of the FIG. Instead of a guide surface as an installation and positioning aid, the circuit board 106 has a guide groove 126.

FIG. 3 illustrates a coil arrangement 200 which comprises six receiving coils 210, which are arranged symmetrically and with the same angular spacings around the one central transmitting coil 220. The one central transmitting coil 220 can also comprise a group of several transmitting coils 220, as shown in FIG. 4. The circuit board 106 has on the outer contour two guide grooves 126, which are used for positioning within the housing 104 in a way analogous to the guide surfaces 124, as described in relation to FIG. 1.

The exemplary embodiment according to FIG. 4 differs from the previous exemplary embodiments in the fact that a group of three transmitting coils 220 is arranged centrally in the center of likewise three receiving coils 210. The transmitting coils 220 are connected to one another in series. The receiving coils 210 are connected to one another in series.

The central longitudinal axis 102 does not coincide with any of the coil axes 212, 222.

Figure 5:
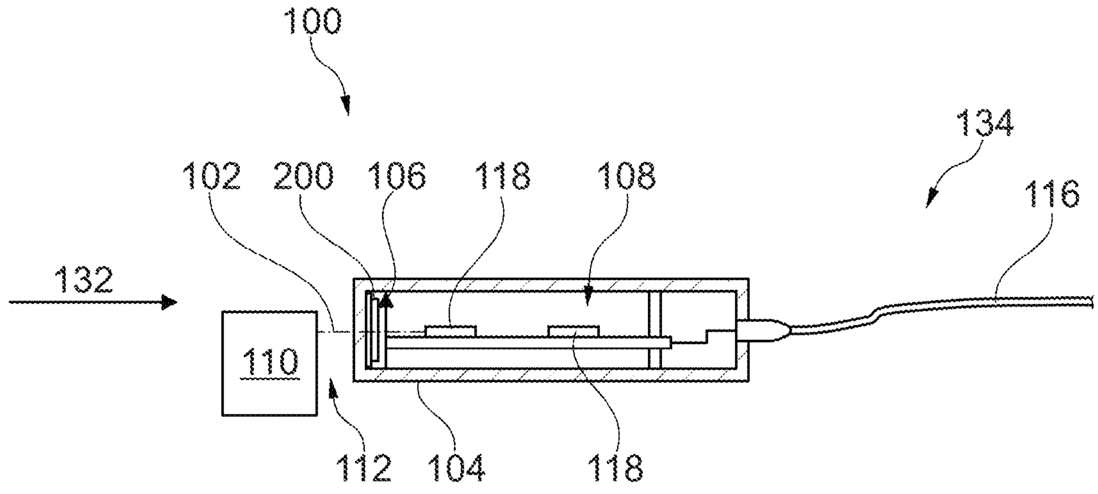
FIG. 5 shows a vertical sectional illustration in the longitudinal direction of the proximity sensor as an overview.

The proximity sensor 100 is illustrated in FIG. 5, wherein the circuit board 106 with the coil arrangement 200 is arranged on a detection side 132, and the connecting cable 116 for the data-carrying and current-carrying connection to the circuit board 106 and its components 118 of the control and evaluation unit 108 are arranged on a connection side 134.

LIST OF REFERENCE SYMBOLS

100 Proximity switch
102 Longitudinal axis
104 Housing
106 Circuit board
108 Control and evaluation unit
110 Trigger, target
112 Response distance
114 Copper layer
116 Connecting cable
118 Components
120 Guide groove
122 Direction
124 Guide surface
126 Guide groove
128 Spacing
130 Direction
132 Detection side
134 Connection side
200 Coil arrangement
210 Receiving coils
212 Coil axis of 210
214 Coil plane
220 Transmitting coil
222 Coil axis of 220
230 Coil plane
240 Coil base surface

What is claimed is:

1. A proximity switch, comprising:

a coil arrangement including at least two receiving coils and at least one transmitting coil, and a control and evaluation unit arranged downstream of the coil arrangement, the control and evaluation unit being configured to obtain a switching signal when a target approaches a predefined response distance of the proximity switch, wherein the at least two receiving coils and the at least one transmitting coil are planar coils and are arranged in a common coil plane being arranged completely within one single copper layer, wherein the common coil plane is oriented perpendicularly to a longitudinal axis of the proximity switch, wherein coil axes of the at least two receiving coils and the at least one transmitting coil are each arranged in parallel to the longitudinal axis of the proximity switch, and wherein the at least two receiving coils and the at least one transmitting coil do not overlap one another in a direction of the longitudinal axis of the proximity switch and do not enclose one another circumferentially.

2. The proximity switch according to claim 1, wherein the coil axis of the at least one transmitting coil is located radially on an inside in the common coil plane, and the coil axes of the at least two receiving coils are located radially on an outside of the common coil plane.

3. The proximity switch according to claim 1, wherein exactly one transmitting coil is provided, the coil axis of which extends in alignment with the longitudinal axis, and wherein the coil axes of the at least two receiving coils have an identical spacing from the coil axis of the transmitting coil.

4. The proximity switch according to claim 3, wherein three to six receiving coils are provided, the coil axes of which are arranged concentrically around the coil axis of the transmitting coil.

5. The proximity switch according to claim 1, wherein each receiving coil has a number S of windings, and each transmitting coil has a number E of windings, wherein a ratio $\Sigma S/\Sigma E$ lies in a range from 0.46 to 0.30.

6. The proximity switch according to claim 1, wherein a ratio of a coil base surface of one of the at least two receiving coils to a coil base surface of the at least one transmitting coil is 1 plus/minus 0.2.

7. The proximity switch according to claim 1, wherein a distance in the common coil plane between an outermost winding of at least one of the at least two receiving coils and an outermost winding of the at least one transmitting coil is a multiple of a winding spacing of the at least one of the at least two receiving coils and lies in a range from 0.8 to 3.

8. A method, comprising:

detecting a target using the proximity switch according to claim 1.

* * * * *